United States Patent
Meagley et al.

(10) Patent No.: US 6,566,280 B1
(45) Date of Patent: May 20, 2003

(54) FORMING POLYMER FEATURES ON A SUBSTRATE

(75) Inventors: Robert P. Meagley, Hillsboro, OR (US); Michael D. Goodner, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/227,678

(22) Filed: Aug. 26, 2002

(51) Int. Cl.$^7$ ................... H01L 21/31; H01L 21/302
(52) U.S. Cl. ................... 438/780; 438/781; 438/759; 438/706
(58) Field of Search .................. 438/780, 781, 438/283, 697, 759, 253, 706

(56) References Cited

U.S. PATENT DOCUMENTS

| | | | | |
|---|---|---|---|---|
| 4,296,146 A | * | 10/1981 | Penn | 427/58 |
| 5,545,512 A | * | 8/1996 | Nakato | 430/323 |
| 5,641,610 A | * | 6/1997 | Bartha et al. | 430/313 |
| 5,665,251 A | * | 9/1997 | Robertson et al. | 216/22 |
| 5,695,896 A | * | 12/1997 | Pierrat | 430/5 |
| 5,759,748 A | * | 6/1998 | Chun et al. | 430/323 |
| 5,789,140 A | * | 8/1998 | Chou et al. | 430/296 |
| 5,853,921 A | * | 12/1998 | Moon et al. | 430/5 |
| 5,925,494 A | * | 7/1999 | Horn | 430/270.1 |
| 6,171,761 B1 | * | 1/2001 | Minamide et al. | 430/313 |
| 6,177,236 B1 | * | 1/2001 | Apte | 430/320 |
| 6,184,041 B1 | * | 2/2001 | Furukawa et al. | 430/396 |
| 6,221,562 B1 | * | 4/2001 | Boyd et al. | 430/314 |
| 6,258,514 B1 | * | 7/2001 | Montgomery | 430/315 |
| 6,348,301 B1 | * | 2/2002 | Lin | 430/330 |
| 6,376,157 B1 | * | 4/2002 | Tanaka et al. | 430/314 |
| 6,383,952 B1 | | 5/2002 | Subramanian et al. | 438/781 |
| 6,399,508 B1 | * | 6/2002 | Ting et al. | 438/706 |
| 6,492,069 B1 | * | 12/2002 | Wu et al. | 430/5 |
| 6,497,996 B1 | * | 12/2002 | Naya et al. | 430/323 |
| 6,511,793 B1 | * | 1/2003 | Cho et al. | 430/323 |
| 2002/0058199 A1 | * | 5/2002 | Zampini et al. | 430/270.1 |

* cited by examiner

Primary Examiner—Michael S. Lebentritt
(74) Attorney, Agent, or Firm—Trop, Pruner & Hu, P.C.

(57) ABSTRACT

Polymer features may be formed on a substrate by applying a polymer to a photoresist pattern which is subsequently removed to generate the desired polymer features.

22 Claims, 3 Drawing Sheets

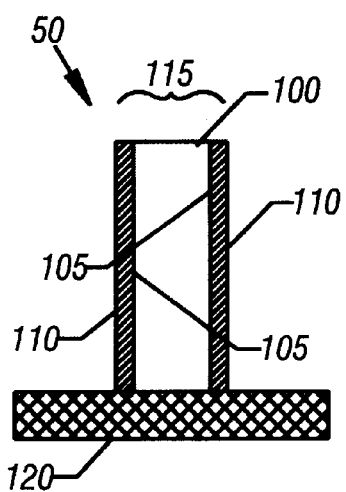
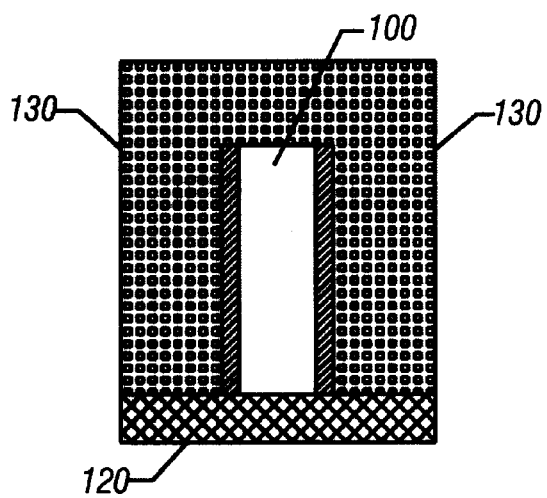
FIG. 1     FIG. 2
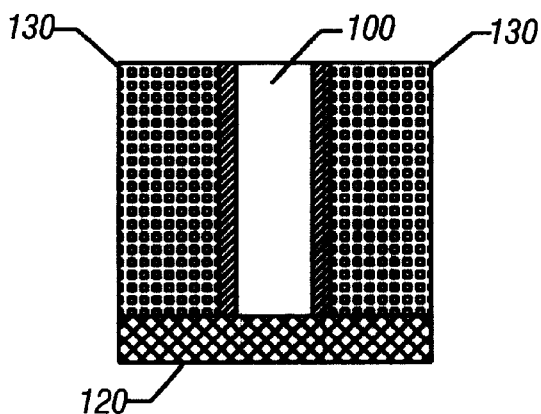
FIG. 3
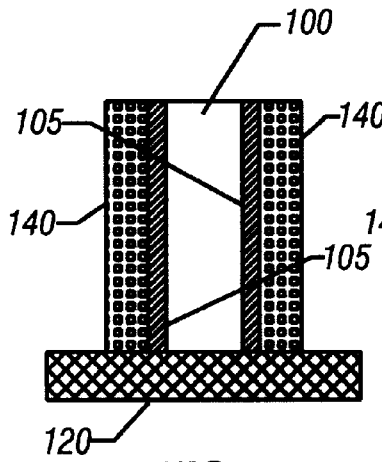 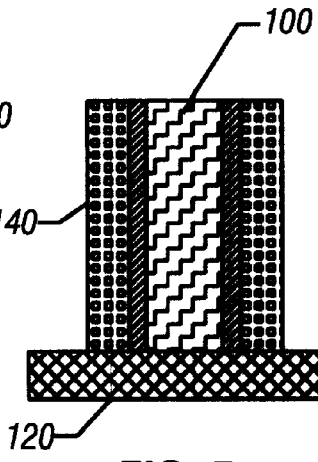 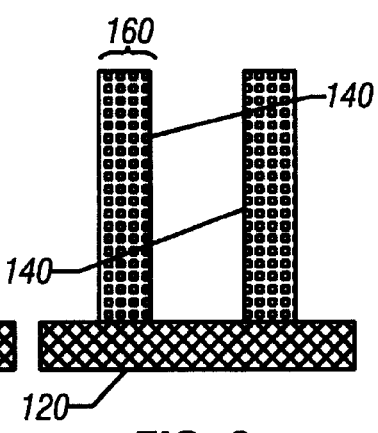
FIG. 4     FIG. 5     FIG. 6

FORMING POLYMER FEATURES ON A SUBSTRATE

BACKGROUND

The invention relates to semiconductor manufacture and more specifically to the use of a polymer material to form features on a substrate.

Manufacture of semiconductor devices typically involves a series of processes in which various layers are deposited and patterned on a substrate to form a device of the desired type. Line and space patterns in photoresist are often created during modern semiconductor processing to form microelectronic devices. Smaller critical dimensions ("CD") for both lines and spaces allow faster circuitry to be created. The sum of the width of a line plus the space CD is termed pitch. Tighter pitch and smaller CD's are needed in each new technology node.

Tight pitch/small CD devices are presently created by patterning with shorter wavelengths and CD reduction by overetching. Spacer gates, which are formed from spacers, or thin layers formed adjacent to sidewalls of patterned features, are formed by plasma deposition of a template followed by photoresist patterning, etching, and then plasma deposition of the spacer material followed by etch and/or planarization to form the free standing spacer. However, because of the inorganic nature of the materials and the process employed, rework is not an option. Additionally, line edge roughness ("LER") can be a problem in lithographic processing. Thus a need exists to create features such as lines and spacers, for example, with tighter pitch.

BRIEF DESCRIPTION OF THE DRAWINGS

FIG. 1 is an enlarged partial cross-section view of a photoresist pattern in accordance with one embodiment of the invention.

FIG. 2 is an enlarged partial cross-section view of the photoresist pattern with an applied polymer in accordance with one embodiment of the invention.

FIG. 3 is an enlarged partial cross-section view of the photoresist pattern with an applied polymer in accordance with another embodiment of the invention.

FIG. 4 is an enlarged partial cross-section view of the photoresist pattern with a cross-linked polymer layer in accordance with one embodiment of the invention.

FIG. 5 is an enlarged partial cross-section view of the photoresist pattern with a cross-linked polymer layer after exposure in accordance with one embodiment of the invention.

FIG. 6 is an enlarged partial cross-section view of polymer features obtained in accordance with one embodiment of the invention.

DETAILED DESCRIPTION

Figure 7:
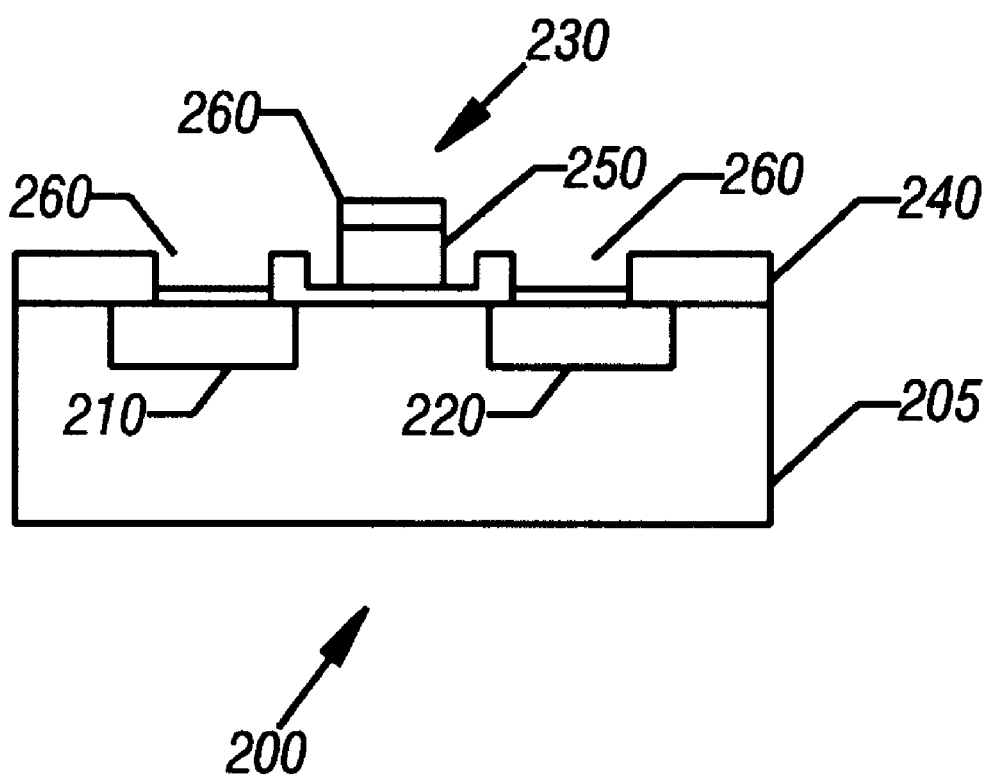
FIG. 7 is an enlarged cross-section view of a spacer gate transistor formed in accordance with one embodiment of the invention.

In one embodiment of a process according to the present invention, a polymer, and more particularly an acid catalyzed cross-linking material, may be used to form thin, etch resistant structures or features. In one embodiment, the polymer may be a resolution enhancement lithography assisted by chemical shrink ("RELACS") polymer. In certain embodiments, the polymer material may be a polymer system having a selected polymer and desired additives, which may vary depending on process requirements. As used herein, the terms "polymer," "polymer system" and "polymer material" refer to both a polymer, such as the base polymer for RELACS, and a blend of the polymer with one or more desired additives.

The structures formed from the polymer system may be used in connection with a spacer gate process. In such an embodiment, a thin linear feature may be deposited at a patterned photoresist edge to thereby half the pitch of photoresist line/space patterns, or leave thin lines at precisely defined regions through a spin-expose-develop process. The thickness of such thin lines may be modulated through process parameters including resist exposure dose and wavelength and polymer bake time and temperature.

Embodiments of the present invention may use polymer materials to create small CD resist lines without the need for next generation lithography or CD reduction in etch. Embodiments may be integrated into various integrated circuit processing schemes, including, for example, application specific integrated circuit ("ASIC") processing, allowing and enabling advanced architectures to be created using extensions of current lithographic tools. Spacer gate technology may be implemented using embodiments of the present invention by allowing rework and/or regional control of space CD.

In embodiments of the present invention, line edge roughness may be controlled by choosing a resist material optimized to mitigate deleterious LER. Line edge roughness may be controlled by using intrinsically smooth resist materials and exposure targeted within the resolution limit of the resist materials. For example, 248 nanometer ("nm") resist may be used to create sacrificial line edges with high numerical aperture ("NA") 248 nm exposures. LER may further be controlled by choosing a resist material having exposure requirements that are not targeted at the limit of resolution, thus improving substantially the smoothness of the resist line edges.

As discussed above, in certain embodiments the polymer to be used may be RELACS, commercially available from Clariant Corp., Branchburg, N.J. When applied over chemically amplified photoresist patterns, RELACS and other acid catalyzed cross-linked materials form a cross-linked layer at the polymer/resist interface, due to catalysis by resist surface acid. This layer remains insoluble in developer, is conformal, is of controllable thickness, and forms only where residual acid remains on the surface of the photoresist pattern (generally occurring at a resist sidewall).

In certain embodiments, a blanket or patterned exposure (i.e., a "preexposure") may be applied to a preformed photoresist pattern prior to application of the polymer material. This exposure may be followed by a baking process to redistribute the residual acid. Such exposure and/or bake may be used to create controlled variations in the thickness of the cross-linked polymer layer. In so doing, the size of the free standing polymer features, as characterized by the develop check critical dimension ("DCCD"), may be controlled regionally after a removal process.

FIGS. 1–6 are partial enlarged cross-section views of a process for forming polymer structures in accordance with embodiments of the present invention. Referring to FIG. 1, a system 50 is shown having a patterned photoresist feature 100 with residual surface acid 110 on each sidewall 105. The width of the photoresist feature 100, including the residual surface acid 110, is the template CD 115. It is to be understood that the thickness of the residual surface acid 110 shown in FIG. 1 is exaggerated for purposes of clarity. As shown in FIG. 1, the photoresist feature 100 is disposed over a first layer 120, which may be an underlying substrate or another layer. It is to be understood that the photoresist feature 100 may be part of a photoresist pattern or template having a plurality of features. For purposes of this discussion, reference numeral 100 will be used to refer both to the specific resist feature as well as a larger pattern or template (not shown in FIG. 1). Such a photoresist template may be patterned in accordance with standard processing techniques. The photoresist template may be a sacrificial template in that after creation of desired polymer features, the template may be removed.

In certain embodiments, a blanket or a patterned exposure may be performed on the photoresist template to vary the residual acid remaining on the resist pattern prior to further processing. In so doing, variation in the thickness of the cross-linked polymer layer may be controlled as desired. In certain embodiments, the exposure may be performed for a period of up to about five times the clearing dose ("Eo"). The wavelength of such exposure may vary depending on the resist materials used. In certain embodiments, a deep ultraviolet ("DUV") exposure having wavelengths of 248 nm, 193 nm, or 157 nm may be used, while in further embodiments, extremely short ultraviolet ("EUV") exposures of less than 130 nm may be used.

In certain embodiments, the photoresist feature 100 may have been formed using standard lithographic techniques followed by overetch for CD reduction. In such embodiments, the aforementioned blanket or patterned exposure may be required to regenerate surface acid.

Referring now to FIG. 2, the polymer 130 is applied to the photoresist pattern 100. In certain embodiments, it may be applied via spin coating, for example, by a planarizing spin coat. The spin coating may occur at spin rates of between approximately 200–5000 revolutions per minute ("RPM"), and more particularly between approximately 1500–2500 RPM in certain embodiments.

As shown in FIG. 2, the polymer 130 is distributed in a planar fashion over both the photoresist pattern 100 and layer 120. In embodiments in which a preexpose process is performed prior to application of polymer 130, it is desirable to remove at least part of the excess portion of polymer 130, namely that part disposed over photoresist pattern 100, prior to further processing. This removal is desirable because the preexposure may create residual surface acid on the top of photoresist pattern 100 which may become cross-linked with polymer 130. Such removal may be performed via isotropic etching, ashing, or planarization, for example. Even if no preexpose process is performed, such removal may be desirable to sharpen the profile of sidewalls 105. However, in other embodiments, such removal need not be performed.

FIG. 3 shows application of polymer 130 in another embodiment. In this embodiment, the application is performed in a planarizing manner, such as via spin coating, so that polymer 130 is applied to be substantially coplanar with photoresist pattern 100. FIG. 3 also depicts the state of polymer 130 after a partial removal process is performed, as in the embodiment discussed above.

Referring now to FIG. 4, the system 50 is baked, resulting in a thin layer of cross-linked polymer material 140 over the geometry of resist template 100. More specifically, the cross-linked layer 140 occurs on the sidewalls 105 of the photoresist pattern because sufficient residual acid exists to which the polymer may attach. In certain embodiments, the cross-linked layer 140 may be between about 5 nm to about 100 nm thick; however, it is to be understood that the thickness may differ in other embodiments. The baking drives the acid catalyzed cross-linking in the polymer 130. In certain embodiments, the baking may occur for a time period of between approximately 15 seconds and approximately 120 seconds at a temperature of between about 50 to 130 degrees Celsius. Control of the bake temperature and time allows direct control of the thickness of cross-linked layer 140, which dictates the CD of the feature to be formed.

The cross-linked layer 140 is insoluble, whereas the polymer 130 that was not cross-linked is soluble. After baking, the system 50 may be released of the excess polymer material 130 that was not cross-linked. FIG. 4 shows the cross-linked layer 140 after release of the excess polymer material 130. In one embodiment, such releasing may be done by rinsing. The rinsing may be performed using deionized ("DI") water, solvents, supercritical fluids, or a surfactant-aided developer in certain embodiments.

Referring now to FIG. 5, the system 50 is given a blanket exposure to render the photoresist template 100 soluble in a developer solution. In certain embodiments, the substrate then may be baked to aid in rendering the photoresist soluble.

Referring to FIG. 6, the system 50 is shown after the sacrificial photoresist template 100 is removed with a developer solution, releasing free standing structures in the cross-linked polymer layer 140. Thus, through the process, spatial information encoded into the photoresist template 100 is communicated to the cross-linked polymer layer 140 as resulting free standing structures. As shown in FIG. 6, the final CD 160 of the polymer structures 140 may be smaller than that of the template CD 115 shown in FIG. 1. In certain embodiments, the polymer features generated may have half of the pitch of the original photoresist template pattern.

It is to be understood that at any stage of the process described above, rework may be performed to facilitate defect-free processing. The rework may be accomplished via ashing, wet cleaning, and/or other known rework techniques.

The above process may be used in one embodiment to create spacer gate transistors. For example, FIG. 7 shows a spacer gate transistor 200 formed using the above process. The transistor 200 formed on substrate 205 includes a source region 210, a drain region 220, and a gate 230. The gate 230 may be formed of an oxide layer 240 and a polysilicon layer 250, over which a metal layer 260 may be disposed.

Figure 8:
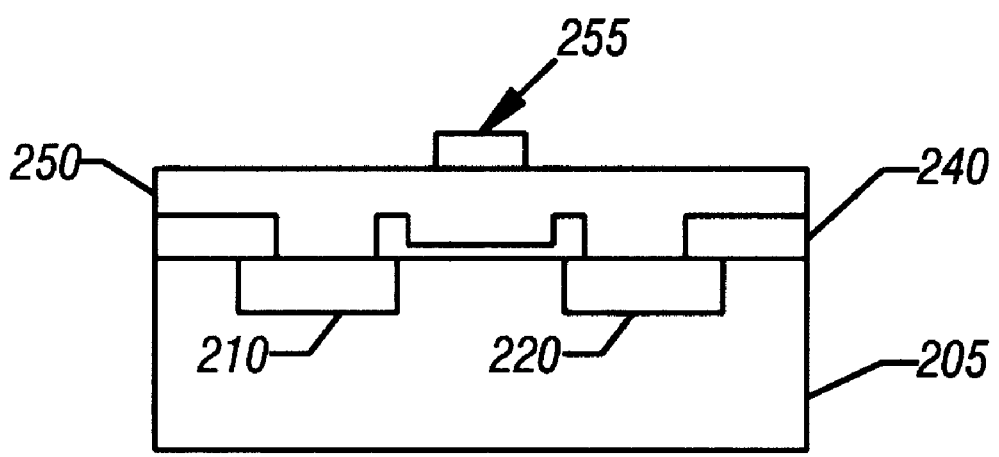
FIG. 8 is an enlarged cross-section view of an intermediate stage of manufacture of the spacer gate transistor in accordance with one embodiment of the invention.

Referring now to FIG. 8, during formation of transistor 200, a polymer spacer 255 may be created in accordance with the above discussion. Such spacer 255 may be used as a mask to pattern the polysilicon layer 250. In such manner, the regions of polysilicon layer 250 not disposed under the spacer 255 may be removed, for example, via etching (not shown in FIG. 8). Then, spacer 255 may be removed to expose the polysilicon layer 250 of the gate 230. Finally, metal layer 260 may be deposited over the polysilicon layer 250 as shown in FIG. 7.

In certain embodiments, application of surfactants and other surface energy modulating components to the polymer formulation may be desired to facilitate resolution. Similarly, colloidal fillers may be added to the polymer formulation to form a composite polymer material to optimize the material for substrate and process requirements.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
    applying a polymer to a patterned photoresist template that is formed on a substrate;
    baking the substrate having the polymer and the patterned photoresist template; and
    removing the patterned photoresist template to generate a plurality of structures formed of the polymer.

2. The method of claim 1, further comprising exposing the patterned photoresist template to radiation of a selected wavelength prior to applying the polymer.

3. The method of claim 2, further comprising removing a first portion of the polymer prior to the baking so that a remaining portion of the polymer is substantially coplanar with the patterned photoresist template.

4. The method of claim 1, wherein the polymer may enable resolution enhancement lithography via a chemical shrink process.

5. The method of claim 1, further comprising rinsing the substrate after the baking to remove excess polymer.

6. The method of claim 1, further comprising exposing the substrate to radiation of a selected wavelength and baking for a second time, prior to the removing.

7. The method of claim 6, wherein the patterned photoresist template is removed with a developer solution.

8. The method of claim 1, further comprising using the plurality of structures to form features for spacer gate transistors.

9. The method of claim 1, further comprising reworking the substrate.

10. The method of claim 1, wherein the polymer is applied by spin coating it on the substrate via a planarizing spin coat.

11. A method comprising:
    creating a sacrificial photoresist template on a substrate;
    applying a polymer to the sacrificial photoresist template;
    forming a cross-linked polymer layer adjacent at least a portion of the sacrificial photoresist template by baking;
    releasing excess polymer; and
    removing the sacrificial photoresist template, leaving structures formed of the cross-linked polymer layer.

12. The method of claim 11, further comprising exposing the sacrificial photoresist template to radiation of a selected wavelength prior to applying the polymer.

13. The method of claim 12, further comprising removing a first portion of the polymer prior to the baking so that a remaining portion of the polymer is substantially coplanar with the sacrificial photoresist template.

14. The method of claim 11, wherein the polymer may enable resolution enhancement lithography via a chemical shrink process.

15. The method of claim 11, further comprising exposing the substrate to radiation of a selected wavelength and baking for a second time, prior to the removing.

16. The method of claim 11, further comprising reworking the substrate.

17. The method of claim 11, wherein the excess polymer is released by rinsing it off of the substrate.

18. A method comprising:
    creating a source region and a drain region on a substrate; and
    forming a structure disposed above and adjacent the source region and the drain region by creating a photoresist template on the substrate, applying a polymer to the photoresist template, baking the substrate having the polymer and the photoresist template to obtain a cross-linked polymer layer adjacent at least a portion of the photoresist template, and removing the photoresist template.

19. The method of claim 18, further comprising using the structure as a mask.

20. The method of claim 19, further comprising removing a polysilicon layer from regions of the substrate not under the mask.

21. The method of claim 20, further comprising removing the structure to expose a polysilicon gate.

22. The method of claim 21, further comprising applying a metal layer to at least the polysilicon gate.

* * * * *